United States Patent
Singh

(10) Patent No.: US 10,470,331 B1
(45) Date of Patent: Nov. 5, 2019

(54) CABINET FOR SERVER

(71) Applicant: Sunil G. Singh, East Brunswick, NJ (US)

(72) Inventor: Sunil G. Singh, East Brunswick, NJ (US)

(73) Assignee: SERVERCUBE, INC.

( * ) Notice: Subject to any disclaimer, the term of this patent is extended or adjusted under 35 U.S.C. 154(b) by 0 days.

(21) Appl. No.: 16/132,377

(22) Filed: Sep. 15, 2018

(51) Int. Cl.
*H05K 7/14* (2006.01)
*G06F 1/18* (2006.01)
*G06F 1/20* (2006.01)
*H05K 7/20* (2006.01)

(52) U.S. Cl.
CPC ....... *H05K 7/1488* (2013.01); *H05K 7/20736* (2013.01); *G06F 1/184* (2013.01); *G06F 1/20* (2013.01)

(58) Field of Classification Search
CPC ............ G06F 1/20; G06F 1/181; G06F 1/184; H05K 7/20172; H05K 7/20736; H05K 7/1488
See application file for complete search history.

(56) References Cited

U.S. PATENT DOCUMENTS

| | | | | |
|---|---|---|---|---|
| 6,238,029 B1 * | 5/2001 | Marzec | ............ | H02B 1/30 211/26 |
| 7,804,690 B2 * | 9/2010 | Huang | ............ | H05K 7/20736 312/223.2 |
| 7,978,469 B2 * | 7/2011 | Tsakanikas | ............ | G06F 1/18 165/104.33 |
| 2007/0211439 A1* | 9/2007 | Shimizu | ............ | H05K 7/20563 361/724 |
| 2007/0217139 A1* | 9/2007 | Lin | ............ | G06F 1/181 361/727 |
| 2013/0267160 A1* | 10/2013 | Hung | ............ | H05K 7/20736 454/184 |
| 2016/0113156 A1* | 4/2016 | Varreiter | ............ | H05K 7/1492 361/692 |

* cited by examiner

*Primary Examiner* — James Wu

(57) ABSTRACT

Disclosed is a cabinet assembly for a server. The cabinet assembly is a metallic cubical compartment and includes portions, such as front, back, first side, second side, top, and bottom portions, which when assembled, forms the cubical compartment for enclosing various components of a server therein. The cabinet assembly further includes a slot arrangement for holding processing components of the server. The cabinet assembly further includes a chassis arrangement for mounting at least one motherboard of the server. The cabinet assembly further includes a fan mounting bracket for mounting a plurality of fans for dissipating heat generated by the server. Each slot of the fan mounting bracket includes two arcs of the same radius and the two arcs are placed opposite to each other. The cabinet assembly further includes a nut-bolt assembly having at least one nut and one bolt that are used for fastening the cubical compartment.

18 Claims, 17 Drawing Sheets

CABINET FOR SERVER

FIELD OF THE INVENTION

The present invention relates generally to a cabinet, and, more particularly, to a cabinet for a server including one or more sub-cabinets and arrangements for holding and supporting various components of the server.

BACKGROUND

In today's world, a general-purpose computer has already been insufficient to deal with humongous amount of data, so people often use a powerful computing system, such as a server, to store and process the data. Besides, because the cloud computing technology is the most popular development trend, the usage quantity of the server keeps raising. For example, with the advancement and usage of the blockchain technology, the overall demand and improvisation of the server is also increasing.

The concept of the blockchain technology is rooted in decentralization i.e., moving various types of data, processing the various types of data, and performing requisite functionalities away from central authorities. The resulting benefits are greater transparency, enhanced security through redundancy, increased trust through shared authority, as well as an immutable audit trail for a continuous and indefinite transactional history.

Blockchains are used for myriad enterprise applications whenever there is a need for strict and transparent data control with a mathematically sound function. However, today, most of these critical blockchain activities operate under the current cloud computing paradigm which relies on large and standalone data centers. This concept of the centralized data centers is very antithesis of the definition of the blockchain.

Additionally, these industrial scale operations employ command and control management models that are by nature vulnerable. Large data centers concentrate computing power in a very monopolistic way. It requires faith and trust in a few multi-billion-dollar enterprises to validate access and guarantee security. All of this is in stark contrast to the blockchain paradigm, which offers an open access model and relies on scalable computing power distributed around the world. Now, as the blockchain applications multiply, the move to decentralize is reaching an inflection point, and thus options are needed immediately.

Also, when these large data centers operate, a huge amount of heat is generated and causes the overheating issue. In many typical mainframe computers, inefficient heat dissipation performance is usually the case that causes the computer to malfunction. In addition, taking the power consumed by these servers of any common data center for instance, the power used by the heat dissipation system for maintaining the operation of such large datacenters is also twice as much. And not to mention that the complexity of the heat dissipation system for modern cloud data centers that are crowded with servers in high density is generally almost double comparing with those for common data centers. Thus, the datacenters, in today's world, not only occupy large spaces but also consume a large amount of power.

In light of the foregoing, there exists a need for a technical and more reliable solution that solves the above-mentioned problems and provides a server cabinet that is easy to move from one location to another location and occupies less space. Furthermore, the server cabinet should reduce the loading of the heat exchangers and save energy to solve the issues mentioned above.

BRIEF SUMMARY

It is an objective of the present invention to provide a cabinet assembly for enclosing a server and its associated components in a flexible manner. The cabinet assembly is designed with compact and sturdy structure for enclosing the server that can operate in private residences or in small clusters. The server is a small high computing density server that may be referred to as a ServerCube (SC) device. The SC devices includes multiple graphics processing units (GPUs) as well as other components which allow them to be used with blockchain-as-a-service (BaaS) applications, deep learning artificial intelligence (AI), virtual reality (VR) modeling, or the like. The cabinet assemblies enclosing the SC Devices are intended for distribution to residencies, small offices, libraries, churches, and schools. The goal is to create a global high-density swarm computing network without owning or building datacenters, which are very expensive and occupy a very large space.

According to an aspect of the present invention, there is provided a cabinet assembly for a server. The cabinet assembly comprises a front portion, a back portion, a first side portion, a second side portion, a top portion, and a bottom portion, which are assembled together to form a cubical compartment for storing the server and its associated components.

In an embodiment, the front portion is divided into a plurality of sections including at least first, second, third, and fourth front sections. The first and second front sections are symmetrical and parallel to each other and form an upper half of the front portion. The third and fourth front sections are also symmetrical and parallel to each other and form a lower half of the front portion. Shape and size of the first and second front sections are different from shape and size of the third and fourth front sections. Further, each of the first, second, third, and fourth front sections includes a metallic sheet having a plurality of symmetrical openings. The front portion further includes a plurality of quadrilateral-shaped openings that are evenly placed with respect to each other in a row below the third and fourth front sections. The front portion is further attached to a first metallic handle. The first metallic handle is fixed along a horizontal plane that is parallel to the top portion. The first metallic handle is further configurable to rotate along its own axis.

In an embodiment, the back portion is divided into a plurality of sections including at least first, second, third, and fourth back sections. The second and fourth back sections are symmetrical and parallel to each other. The third and fourth back sections are below the first and second back sections, respectively. Further, the first and third back sections are different from the second and fourth back sections. Further, each of the first, second, and fourth back sections include a metallic sheet having a plurality of symmetrical openings. The third back section is an open gateway for externally connecting a power supply component of the server. The power supply component is placed inside the cubical compartment. The back portion is further attached to a second metallic handle. The second metallic handle is fixed along a horizontal plane that is parallel to the top portion. The second metallic handle is further configurable to rotate along its own axis.

In an embodiment, the first or second side portion is divided into a plurality of sections including at least first and second side sections. The first and second side sections are symmetrical and parallel to each other, and the second side section is below the first side section. In an embodiment, the top portion is divided into a plurality of sections including at least first and second top sections. The first and second top sections are symmetrical and parallel to each other, and each of the first and second top sections includes a metallic sheet having a plurality of symmetrical openings. In an embodiment, the bottom portion is divided into a plurality of sections including at least first and second bottom sections, and the first and second bottom sections are parallel to each other. The bottom portion is further attached to a plurality of standoff screws. The cubical compartment stands on the plurality of standoff screws.

The cabinet assembly further comprises a slot arrangement having a plurality of slots that is attached to the top portion. The plurality of slots is used for holding at least a plurality of processing components of the server inside the cubical compartment. Each processing component is held to a respective slot of the slot arrangement by means of a plurality of metallic clamps. Further, at least one slot of the plurality of slots is used for holding a cooling pad including at least a plurality of fans.

The cabinet assembly further comprises a chassis arrangement having a plurality of legs that are attached to the bottom portion. The chassis arrangement is used for mounting at least one motherboard of the server inside the cubical compartment. The at least one motherboard is mounted on top of the chassis arrangement.

The cabinet assembly further comprises a fan mounting bracket having a plurality of slots for mounting a plurality of fans for dissipating heat generated by the server. The fan mounting bracket is attached to an outer surface of one of the first side portion or the second side portion. Each slot of the fan mounting bracket includes at least two arcs of the same radius. The two arcs are placed opposite to each other.

The cabinet assembly further comprises a metallic holder for holding an electronic connector of the server. The metallic holder is attached to the back portion from inside of the cubical compartment. The cabinet assembly further comprises a metallic case with at least one open side. The metallic case is placed below the chassis arrangement and is attached to the bottom portion. The cabinet assembly further comprises a nut-bolt assembly having at least one nut and one bolt. The nut-bolt assembly is used for fastening the cubical compartment.

These and other features and advantages of the invention will become apparent from the detailed description below, in light of the accompanying drawings.

BRIEF DESCRIPTION OF THE ACCOMPANYING DRAWINGS

The novel features which are believed to be characteristic of the present disclosure, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only and are not intended as a definition of the limits of the invention. Embodiments of this disclosure will now be described by way of example in association with the accompanying drawings in which:

Figure 1A:
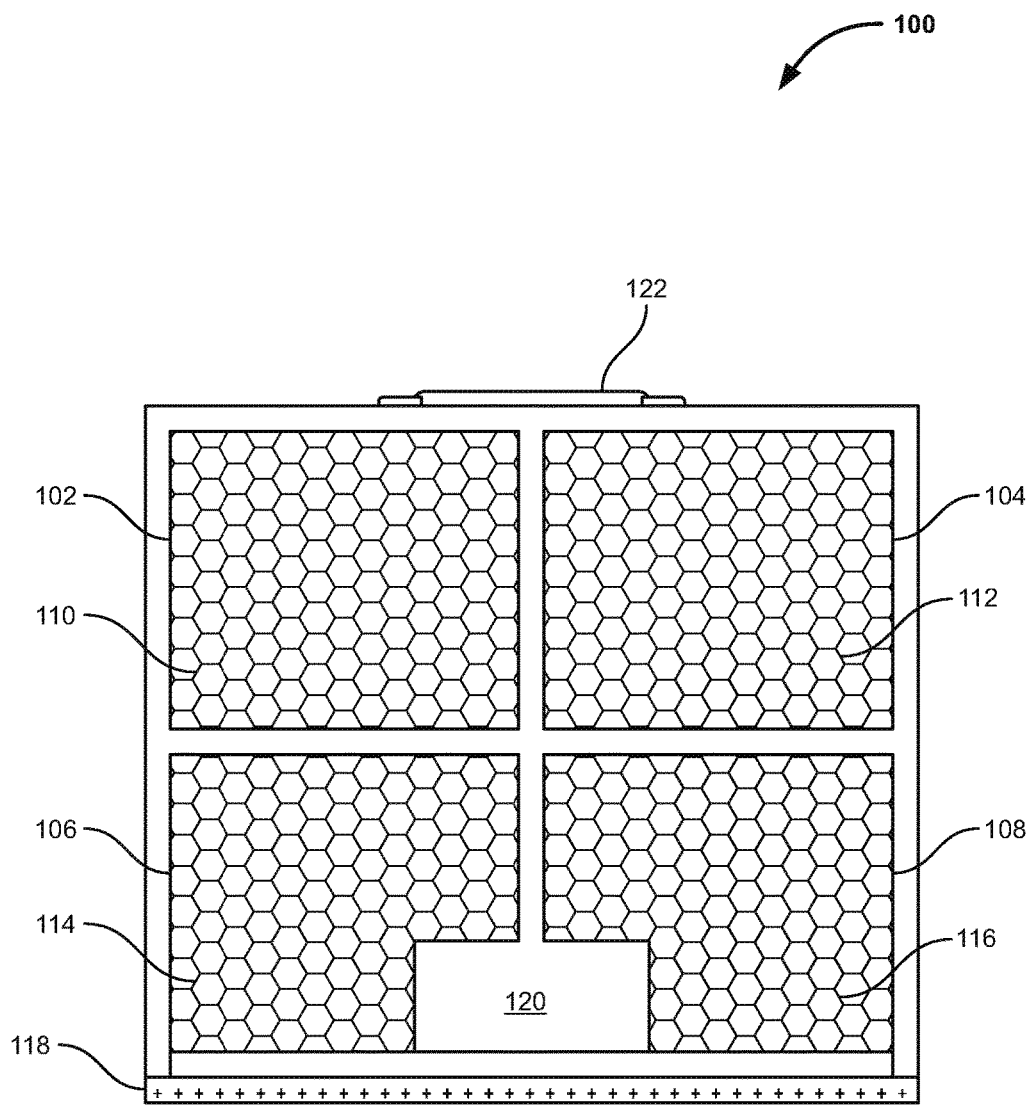
FIG. 1A shows a cross sectional side view of a front portion of a cabinet assembly, in accordance with an embodiment of the present invention.

Further areas of applicability of the present invention will become apparent from the detailed description provided hereinafter. It should be understood that the detailed description of exemplary embodiments is intended for illustration purposes only and is, therefore, not intended to necessarily limit the scope of the invention.

DETAILED DESCRIPTION

As used in the specification and claims, the singular forms "a", "an" and "the" may also include plural references. For example, the term "an article" may include a plurality of articles. Those with ordinary skill in the art will appreciate that the elements in the Figures are illustrated for simplicity and clarity and are not necessarily drawn to scale. For example, the dimensions of some of the elements in the Figures may be exaggerated, relative to other elements, in order to improve the understanding of the present invention. There may be additional components described in the foregoing application that are not depicted on one of the described drawings. In the event such a component is described, but not depicted in a drawing, the absence of such a drawing should not be considered as an omission of such design from the specification.

Before describing the present invention in detail, it should be observed that the present invention utilizes a combination of mechanical components, which constitutes a cabinet assembly for a server. Accordingly, the components have been represented, showing only specific details that are pertinent for an understanding of the present invention so as not to obscure the disclosure with details that will be readily apparent to those with ordinary skill in the art having the benefit of the description herein. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting but rather to provide an understandable description of the invention.

References to "one embodiment", "an embodiment", "another embodiment", "yet another embodiment", "one example", "an example", "another example", "yet another example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

The words "comprising," "having," "containing," and "including," and other forms thereof, are intended to be equivalent in meaning and be open ended in that an item or items following any one of these words is not meant to be an exhaustive listing of such item or items or meant to be limited to only the listed item or items.

Techniques consistent with the present invention provide, among other features, the cabinet assembly for the server. Unless stated otherwise, terms such as "first" and "second" are used to arbitrarily distinguish between the elements such terms describe. Thus, these terms are not necessarily intended to indicate temporal or other prioritization of such elements. While various exemplary embodiments of the disclosed system and method have been described above it should be understood that they have been presented for purposes of example only, not limitations. It is not exhaustive and does not limit the invention to the precise form disclosed. Modifications and variations are possible in light of the above teachings or may be acquired from practicing of the invention, without departing from the breadth or scope.

The cabinet assembly for the server will now be described with reference to the accompanying drawings which should be regarded as merely illustrative without restricting the scope and ambit of the disclosure.

FIG. 1A shows a cross sectional side view of a front portion 100 of a cabinet assembly, in accordance with an embodiment of the present invention. The front portion 100 is divided into a plurality of sections, such as a first front section 102, a second front section 104, a third front section 106, and a fourth front section 108, as shown in FIG. 1A. The first and second front sections 102 and 104 are symmetrical and parallel to each other, and form an upper half of the front portion 100. Similarly, the third and fourth front sections 106 and 108 are symmetrical and parallel to each other, and form a lower half of the front portion 100. Moreover, the third and fourth front sections 106 and 108 are below the first and second front sections 102 and 104. Further, in an embodiment, shape and size of the first and second front sections 102 and 104 are different from shape and size of the third and fourth front sections 106 and 108, as shown in FIG. 1A. For example, the first and second front sections 102 and 104 are quadrilateral-shaped sections (such as square or rectangle sections), and the third and fourth front sections 106 and 108 are irregular pentagonal-shaped or hexagonal-shaped sections (e.g., L-shaped sections), as shown in FIG. 1A.

In an embodiment, the first front section 102 includes a first metallic sheet 110 having symmetrical openings, as shown in FIG. 1A. Similarly, the second, third, and fourth front sections 104, 106, and 108 include second, third, and fourth metallic sheets 112, 114, and 116, respectively, each having symmetrical openings. Each of the first, second, third, and fourth metallic sheets 110, 112, 114, and 116 is a perforated metallic sheet that has been welded to the first, second, third, and fourth front sections 102, 104, 106, and 108, respectively, to obtain the front portion 100. Further, each symmetrical opening associated with each of the first, second, third, and fourth metallic sheets 110, 112, 114, and 116 has a hexagonal shape.

In an embodiment, the front portion 100 further includes a plurality of quadrilateral-shaped openings (denoted by "+") formed on an extended metallic plate 118 of the front portion 100 below the third and fourth front sections 106 and 108, as shown. The plurality of quadrilateral-shaped openings is evenly formed with respect to each other along a single row of the extended metallic plate 118. The front portion 100 further includes a fifth front section 120 that joins portions of the third and fourth front sections 106 and 108. The fifth front section 120 is a metallic plate that can be used for depicting specification of the cabinet assembly. The fifth front section 120 is at the bottom of the front portion 100 along a central vertical axis of the front portion 100, as shown in FIG. 1A. In an embodiment, the front portion 100 is further attached to a first metallic handle 122. The first metallic handle 122 is fixed along a horizontal plane that is parallel to a top portion of the cabinet assembly. The first metallic handle 122 is rotatable along its own axis.

Figure 1B:
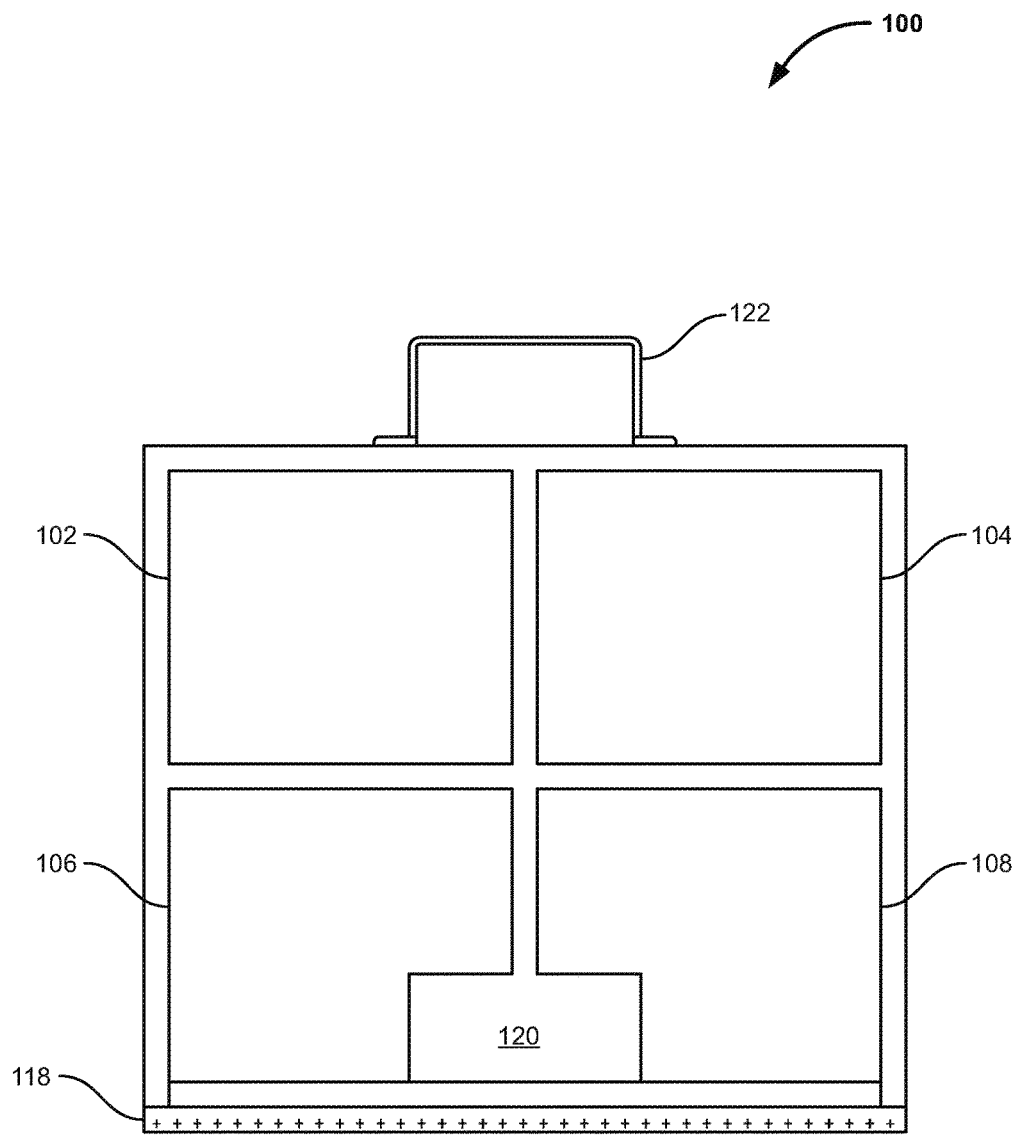
FIG. 1B shows a line diagram of the front portion of the cabinet assembly, in accordance with an embodiment of the present invention.

FIG. 1B shows a line diagram of the front portion 100 of the cabinet assembly, in accordance with an embodiment of the present invention. As shown, the front portion 100 is divided into the first, second, third, fourth, and fifth front sections 102, 104, 106, 108, and 120 and is attached to the first metallic handle 122. The front portion 100 further shows the extended metallic plate 118 with the plurality of quadrilateral-shaped openings (denoted by "+"). In an embodiment, the dimension of the front portion 100 is 14 inches by 12 inches. Thus, the cabinet assembly has a width of 14 inches and a height of 12 inches. Further, the dimension of each of the first and second front sections 102 and 104 is 6.25 inches by 5.25 inches and a gap between the first and second front sections 102 and 104 is 0.5 inch. The dimension of each of the third and fourth front sections 106 and 108 is a by b (in which "a" varies between 4.875 inches and 6.25 inches and "b" varies between 3.125 inches and 5.25 inches) and a gap between the third and fourth front sections 106 and 108 is 0.5 inch. Further, a gap between the first and third front sections 102 and 106 is 0.5 inch and a gap between the second and fourth front sections 104 and 108 is 0.5 inch. The various gaps, as described above, are covered by means of metallic strips, each metallic strip has a width of at least 0.5 inch. The dimension of the fifth front section 120 is about 3.25 inches by 2.125 inches. Further, the dimension of the extended metallic plate 118 is 14 inches by 0.5 inch. Further, each quadrilateral-shaped opening (denoted by "+" in FIG. 1B) formed along the extended metallic plate 118 has sides of equal length i.e., 0.25 inch. Further, the dimension of the first metallic handle 122 is 3.75 inches by 2 inches.

Figure 2A:
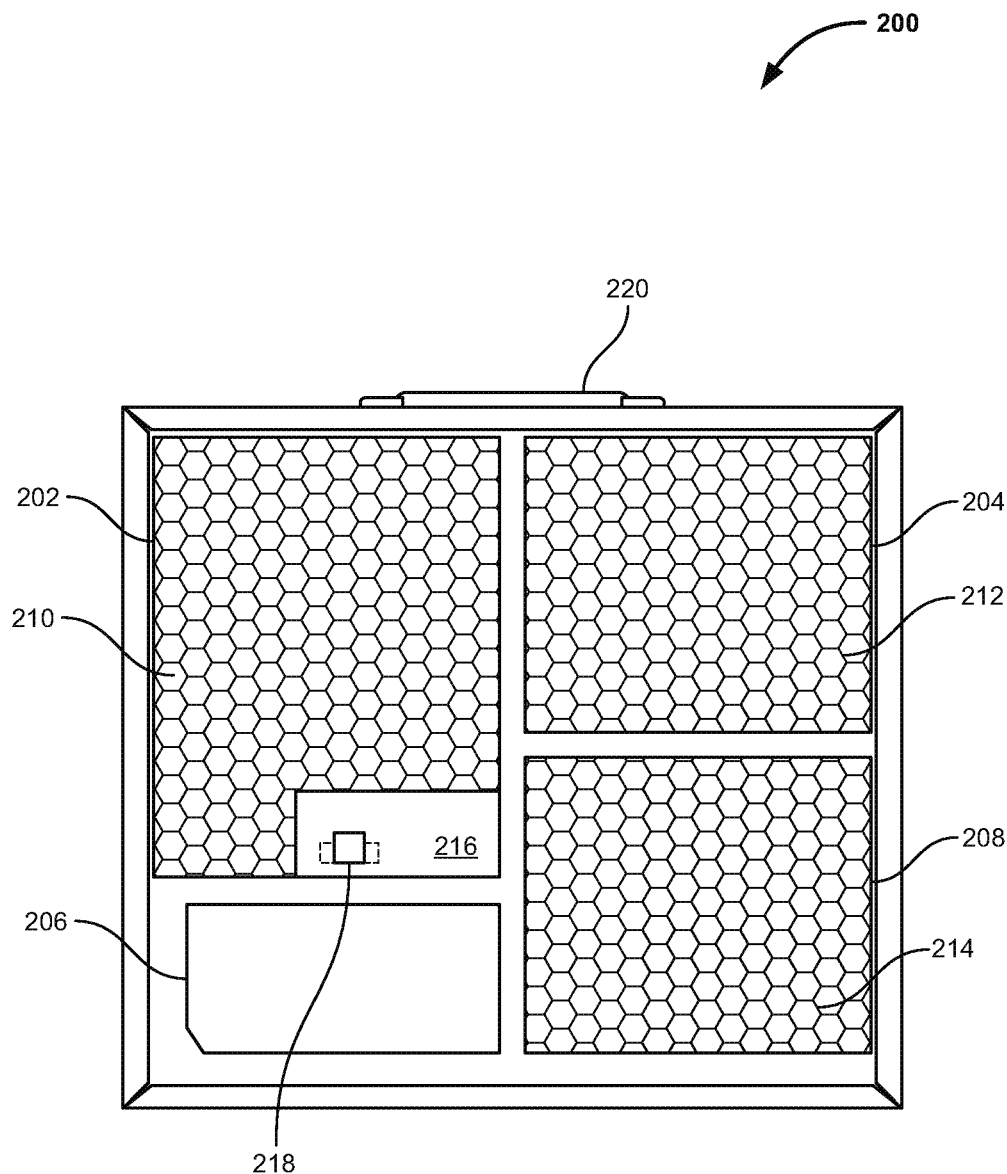
FIG. 2A shows a cross sectional side view of a back portion of the cabinet assembly, in accordance with an embodiment of the present invention.

FIG. 2A shows a cross sectional side view of a back portion 200 of the cabinet assembly, in accordance with an embodiment of the present invention. The back portion 200 is divided into a plurality of sections, such as a first back section 202, a second back section 204, a third back section 206, and a fourth back section 208, as shown in FIG. 2A. The second and fourth back sections 204 and 208 are symmetrical and parallel to each other. Further, the first and third back sections 202 and 206 are different (with respect to shape and size) from the second and fourth back sections 204 and 208. For example, the second and fourth back sections 204 and 208 are quadrilateral-shaped sections (such as square or rectangle sections), and the first and third back sections 202 and 206 are polygonal or hexagonal sections, as shown in FIG. 2A. In an embodiment, the third and fourth back sections 206 and 208 are below the first and second back sections 202 and 204, respectively.

In an embodiment, the first back section 202 includes a first metallic sheet 210 having symmetrical openings, as shown in FIG. 2A. Similarly, the second and fourth back sections 204 and 208 include second and third metallic sheets 212 and 214, respectively, each having symmetrical openings. Each of the first, second, and third metallic sheets 210, 212, and 214 is a perforated metallic sheet that has been welded to the first, second, and fourth back sections 202, 204, and 208, respectively, to form the back portion 200. Further, each symmetrical opening associated with each of the first, second, and third, metallic sheets 210, 212, and 214 has a hexagonal shape. In an embodiment, the third back section 206 is an open gateway for externally connecting a power supply of the server. For example, the open gateway may be used for connecting a power supply device of the server with an external power supply. In an embodiment, the power supply is placed inside the cubical compartment.

In an embodiment, the back portion 200 further includes a fifth back section 216. The fifth back section 216 is a metallic plate including a quadrilateral-shaped opening 218. The fifth back section 216 is between the first and third back sections 202 and 206. In an embodiment, the back portion 200 is further attached to a second metallic handle 220. The second metallic handle 220 is fixed along a horizontal plane that is parallel to a top portion (shown in FIG. 5) of the cabinet assembly. The second metallic handle 220 is rotatable along its own axis. In an embodiment, a user can use the first and second metallic handles 122 and 220 to move the cabinet assembly from one location to another location. In an embodiment, a metallic holder (not shown) for holding an electronic connector of the server is included inside the cubical compartment. The metallic holder is fixed to the back portion 200 from inside of the cubical compartment such that one end of the electronic connector is fitted with the quadrilateral-shaped opening 218.

Figure 2B:
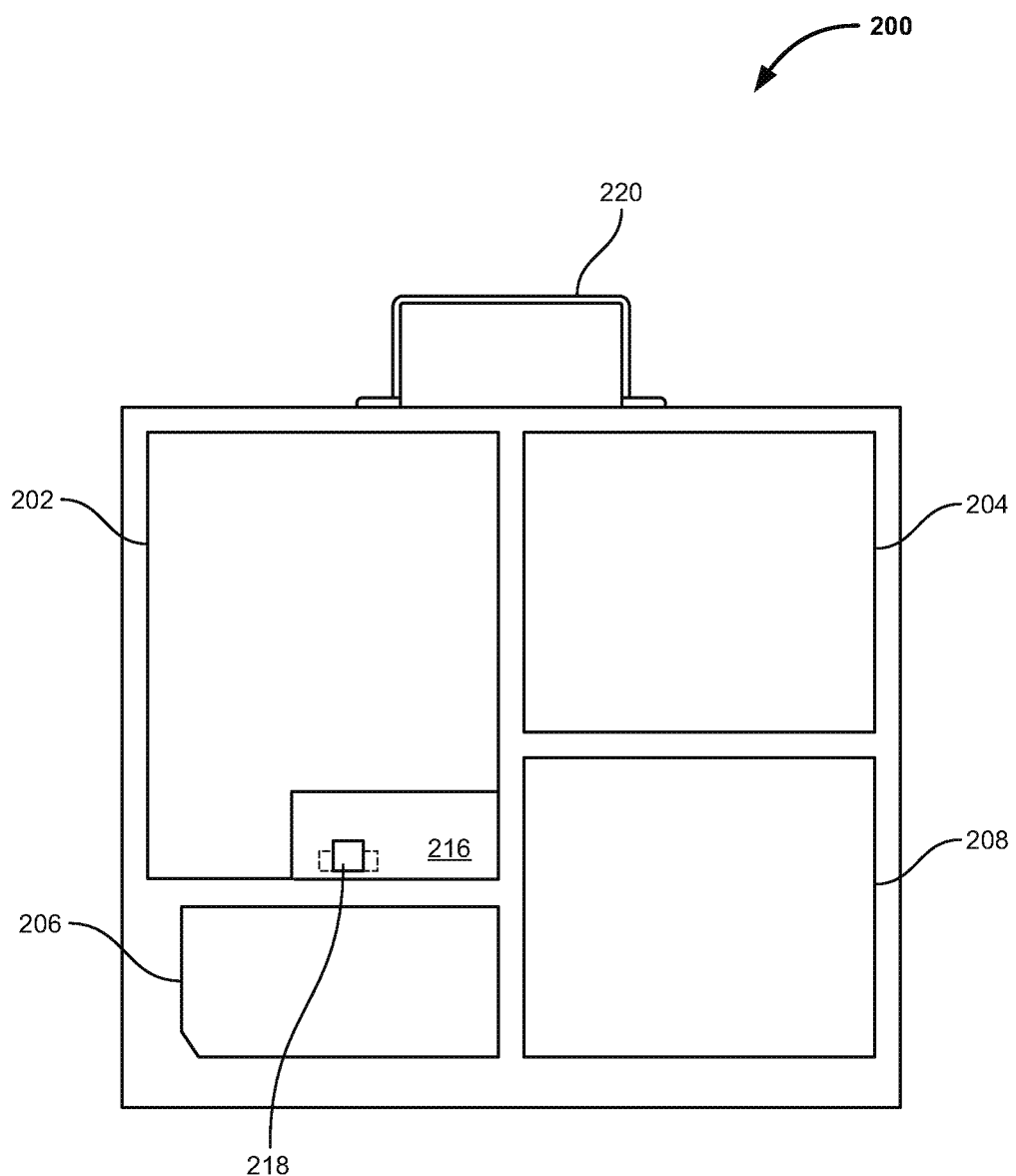
FIG. 2B shows a line diagram of the back portion of the cabinet assembly, in accordance with an embodiment of the present invention.

FIG. 2B shows a line diagram of the back portion 200 of the cabinet assembly, in accordance with an embodiment of the present invention. As shown, the back portion 200 is divided into the first, second, third, fourth, and fifth back sections 202, 204, 206, 208, and 216 and is attached to the second metallic handle 220. In an embodiment, the dimension of the back portion 100 is 14 inches by 12 inches. Further, the dimension of first back section 202 is c by d (in which "c" varies between 2.25 inches and 5.75 inches and "d" varies between 5.6 inches and 7.25 inches). The dimension of each of the second and fourth back sections 204 and 208 is 6 inches by 4.875 inches and a gap between the second and fourth back sections 204 and 208 is 0.75 inch. The dimension of the third back section 206 is e by f (in which "e" varies between 5 inches and 5.375 inches and "f" varies between 2.125 inches and 2.5 inches) and a gap between the third and fourth back sections 206 and 208 is 0.75 inch. Further, a gap between the first and second back sections 202 and 204 is 0.75 inch. The various gaps, as described above, are covered by means of metallic strips, each metallic strip has a width of at least 0.75 inch. The dimension of the fifth back section 120 is 3.25 inches by 2.125 inches. Further, the quadrilateral-shaped opening 218 has sides of equal length i.e., 0.575 inch. Further, the dimension of the second metallic handle 220 is 3.75 inches by 2 inches.

Figure 3A:
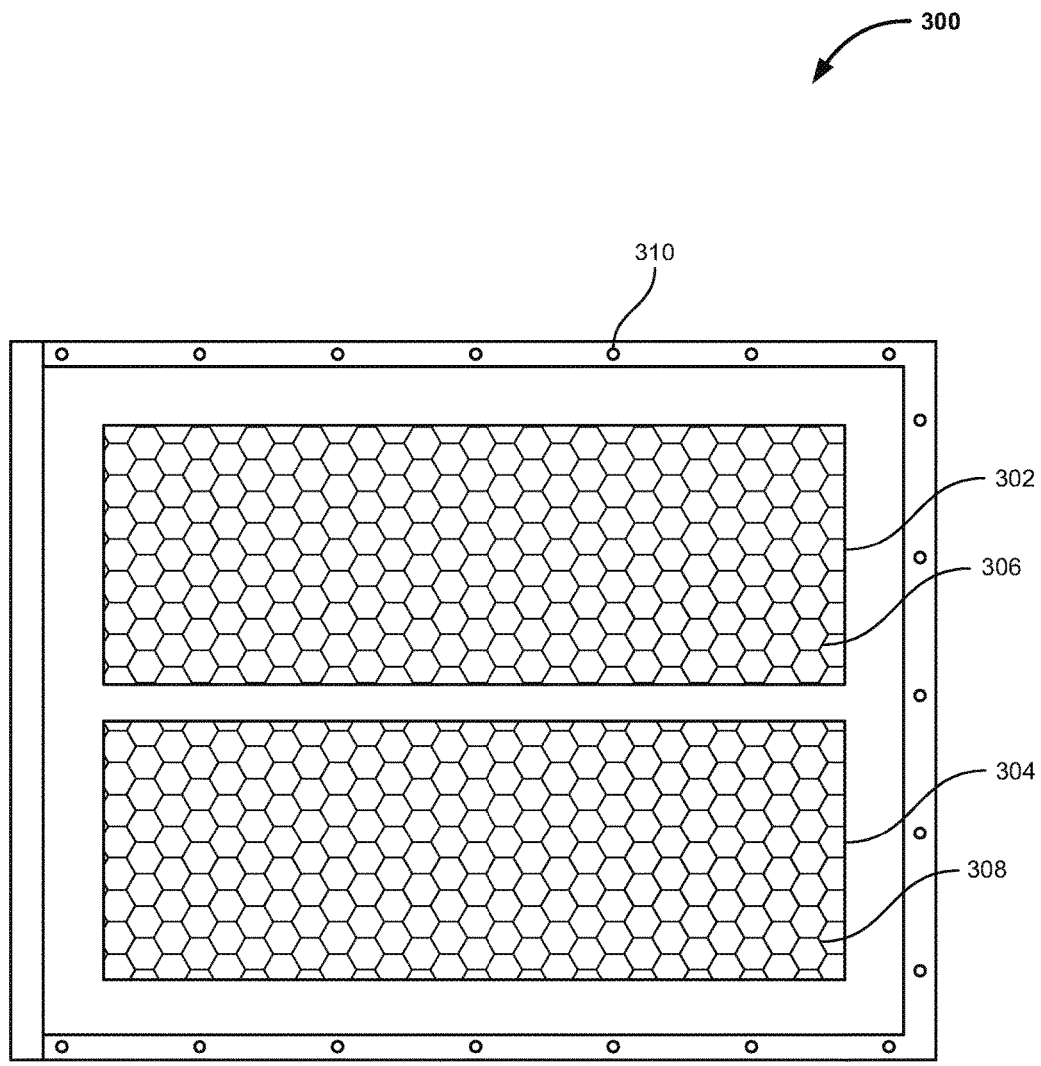
FIG. 3A shows a cross sectional side view of a first side portion of the cabinet assembly, in accordance with an embodiment of the present invention.

FIG. 3A shows a cross sectional side view of a first side portion 300 of the cabinet assembly, in accordance with an embodiment of the present invention. The first side portion 300 is divided into a plurality of sections, such as a first side section 302 and a second side section 304, as shown in FIG. 3A. The first and second side sections 302 and 304 are symmetrical and parallel to each other and the second side section 304 is below the first side section 302, as shown in FIG. 3A.

In an embodiment, the first side section 302 includes a first metallic sheet 306 having symmetrical openings, as shown in FIG. 3A. Similarly, the second side section 304 includes a second metallic sheet 308 having symmetrical openings. Each of the first and second metallic sheets 306 and 308 is a perforated metallic sheet that has been welded to the first and second side sections 302 and 304, respectively, to form the first side portion 300. Further, each symmetrical opening associated with each of the first and second metallic sheets 306 and 308 has a hexagonal shape. In an embodiment, the first side portion 300 is fastened to other portions, such as the front portion 100, the back portion 200, a top portion (shown in FIG. 5) of the cabinet assembly, and a bottom portion (shown in FIG. 6) of the cabinet assembly by means of a plurality of screws, such as a screw 310, as shown in FIG. 3A. The plurality of screws is used along edges (as shown in FIG. 3A) associated with the first side portion 300 to fasten the first side portion 300.

Figure 3B:
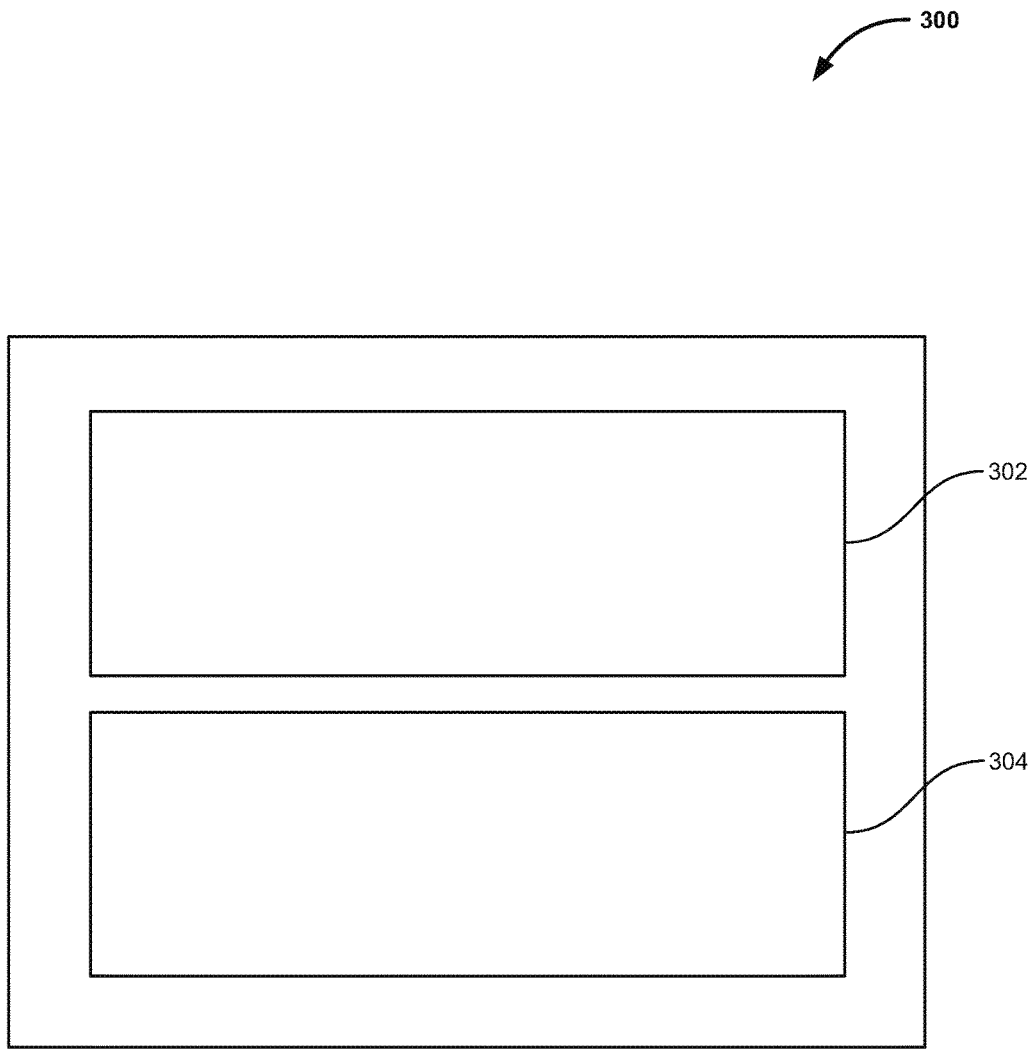
FIG. 3B shows a line diagram of the first side portion of the cabinet assembly, in accordance with an embodiment of the present invention.

FIG. 3B shows a line diagram of the first side portion 300 of the cabinet assembly, in accordance with an embodiment of the present invention. As shown, the first side portion 300 is divided into the first and second side sections 302 and 304. In an embodiment, the dimension of the first side portion 300 is 16.75 inches by 12 inches. Thus, the cabinet assembly has the width of 14 inches, the height of 12 inches, and a length of 16.75 inches. Further, the dimension of each of the first and second side sections 302 and 304 is 13.75 inches by 4.75 inches and a gap between the first and second side sections 302 and 304 is 0.75 inch.

Figure 4:
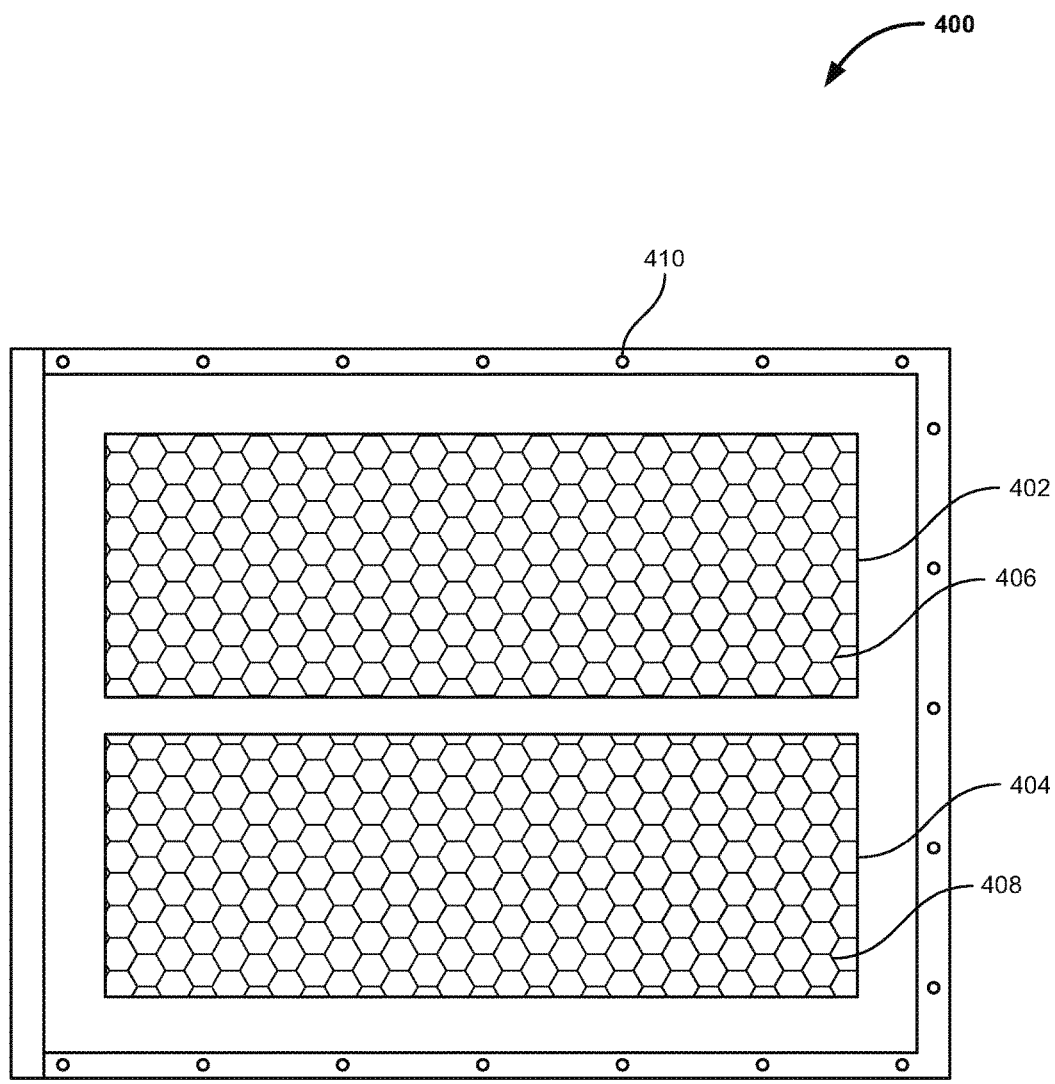
FIG. 4 shows a cross sectional side view of a second side portion of the cabinet assembly, in accordance with an embodiment of the present invention.

FIG. 4 shows a cross sectional side view of a second side portion 400 of the cabinet assembly, in accordance with an embodiment of the present invention. The second side portion 400 is divided into a plurality of sections, such as a first side section 402 and a second side section 404, as shown in FIG. 4. The first and second side sections 402 and 404 are symmetrical and parallel to each other and the second side section 404 is below the first side section 402, as shown in FIG. 4.

In an embodiment, the first side section 402 includes a first metallic sheet 406 having symmetrical openings, as shown in FIG. 4. Similarly, the second side sections 404 includes a second metallic sheet 408 having symmetrical openings. Each of the first and second metallic sheets 406 and 408 is a perforated metallic sheet that has been welded to the first and second side sections 402 and 404, respectively, to form the second side portion 400. Further, each symmetrical opening associated with each of the first and second metallic sheets 406 and 408 has a hexagonal shape. In an embodiment, the second side portion 400 is fastened to other portions, such as the front portion 100, the back portion 200, a top portion (shown in FIG. 5) of the cabinet assembly, and a bottom portion (shown in FIG. 6) of the cabinet assembly by means of a plurality of screws, such as a screw 410, as shown in FIG. 4. The plurality of screws is used along edges (as shown in FIG. 4) associated with the second side portion 400 to fasten the second side portion 400. The dimension of the second side portion 400 is the same as that of the first side portion 300, as described above in conjunction with FIG. 3B.

Figure 5:
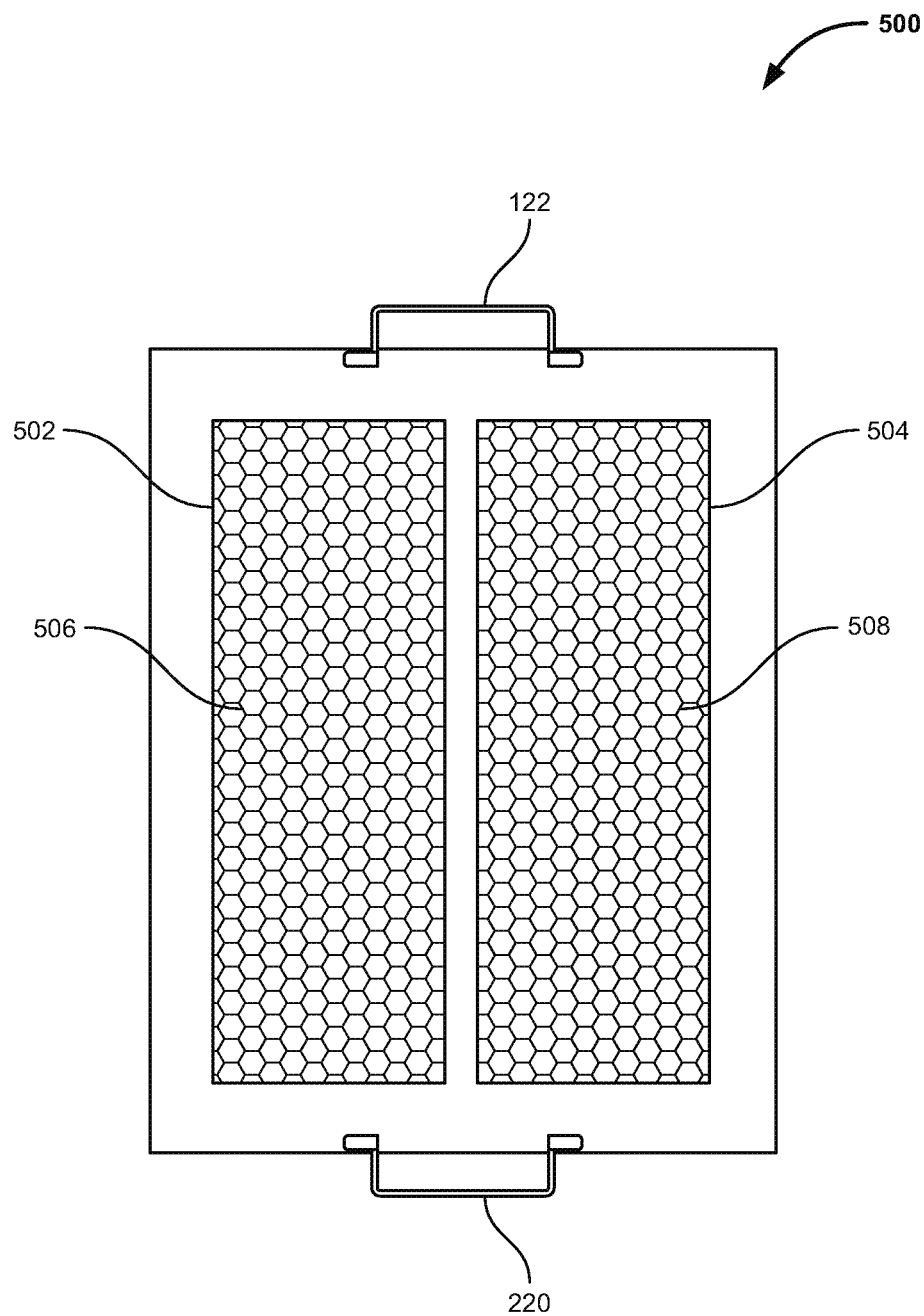
FIG. 5 shows a cross sectional side view of a top portion of the cabinet assembly, in accordance with an embodiment of the present invention.

FIG. 5 shows a cross sectional side view of a top portion 500 of the cabinet assembly, in accordance with an embodiment of the present invention. The top portion 500 is divided into a plurality of sections, such as a first top section 502 and a second top section 504, as shown in FIG. 5. The first and second top sections 502 and 504 are symmetrical and parallel to each other, as shown in FIG. 5. The top portion 500 is further attached to the first and second metallic handles 122 and 220.

In an embodiment, the first top section 502 includes a first metallic sheet 506 having symmetrical openings, as shown in FIG. 5. Similarly, the second top sections 504 includes a second metallic sheet 508 having symmetrical openings. Each of the first and second metallic sheets 506 and 508 is a perforated metallic sheet that has been welded to the first and second top sections 502 and 504, respectively, to form the top portion 500. Further, each symmetrical opening associated with each of the first and second metallic sheets 506 and 508 has a hexagonal shape. In an embodiment, the top portion 500 is fastened to other portions, such as the front portion 100, the back portion 200, the first side portion 300, and the second side portion 400 by means of a plurality of screws (not shown). The plurality of screws can be used along edges associated with the top portion 500 to fasten the top portion 500.

In an embodiment, a slot arrangement having a plurality of slots is attached to an inner surface of the top portion 500. The plurality of slots is used for holding at least a plurality of processing components of the server inside the cubical compartment. Each processing component is held to a respective slot of the slot arrangement by means of a plurality of metallic clamps. Further, at least one slot of the plurality of slots is used for holding a cooling pad including at least a plurality of fans.

Figure 6:
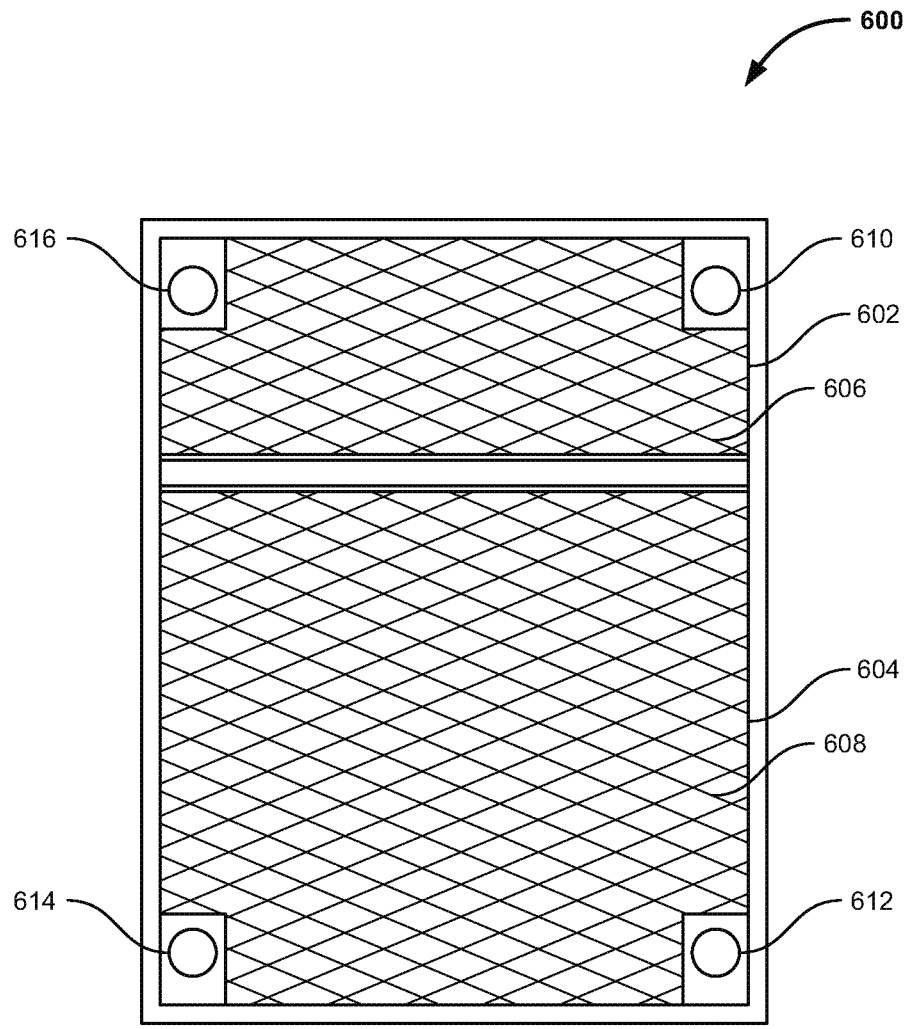
FIG. 6 shows a cross sectional side view of a bottom portion of the cabinet assembly, in accordance with an embodiment of the present invention.

FIG. 6 shows a cross sectional side view of a bottom portion 600 of the cabinet assembly, in accordance with an embodiment of the present invention. The bottom portion 600 is divided into a plurality of sections, such as a first bottom section 602 and a second bottom section 604, as shown in FIG. 6. The first and second bottom sections 602 and 604 are parallel to each other. A width of the first bottom section 602 is same as a width of the second bottom section 604 but a length of the first bottom section 602 is less than a length of the second bottom section 604, as shown in FIG. 6.

In an embodiment, the first bottom section 602 includes a first metallic sheet 606 having symmetrical openings, as shown in FIG. 6. Similarly, the second bottom sections 604 includes a second metallic sheet 608 having symmetrical openings. Each of the first and second metallic sheets 606 and 608 is a perforated metallic sheet that has been welded to the first and second bottom sections 602 and 604, respectively, to form the bottom portion 600. Further, each symmetrical opening associated with each of the first and second metallic sheets 606 and 608 has a hexagonal shape. In an embodiment, the bottom portion 600 is attached to a plurality of standoff screws, such as first, second, third, and fourth standoff screws 610, 612, 614, and 616. The first, second, third, and fourth standoff screws 610, 612, 614, and 616 are detachable standoff screws that can be detached from the bottom portion 600. The cabinet assembly stands on the first, second, third, and fourth standoff screws 610, 612, 614, and 616. In an embodiment, the bottom portion 600 may include a nut-bolt assembly (not shown) having at least one nut and one bolt that are used for fastening the cubical compartment.

Figure 7A:
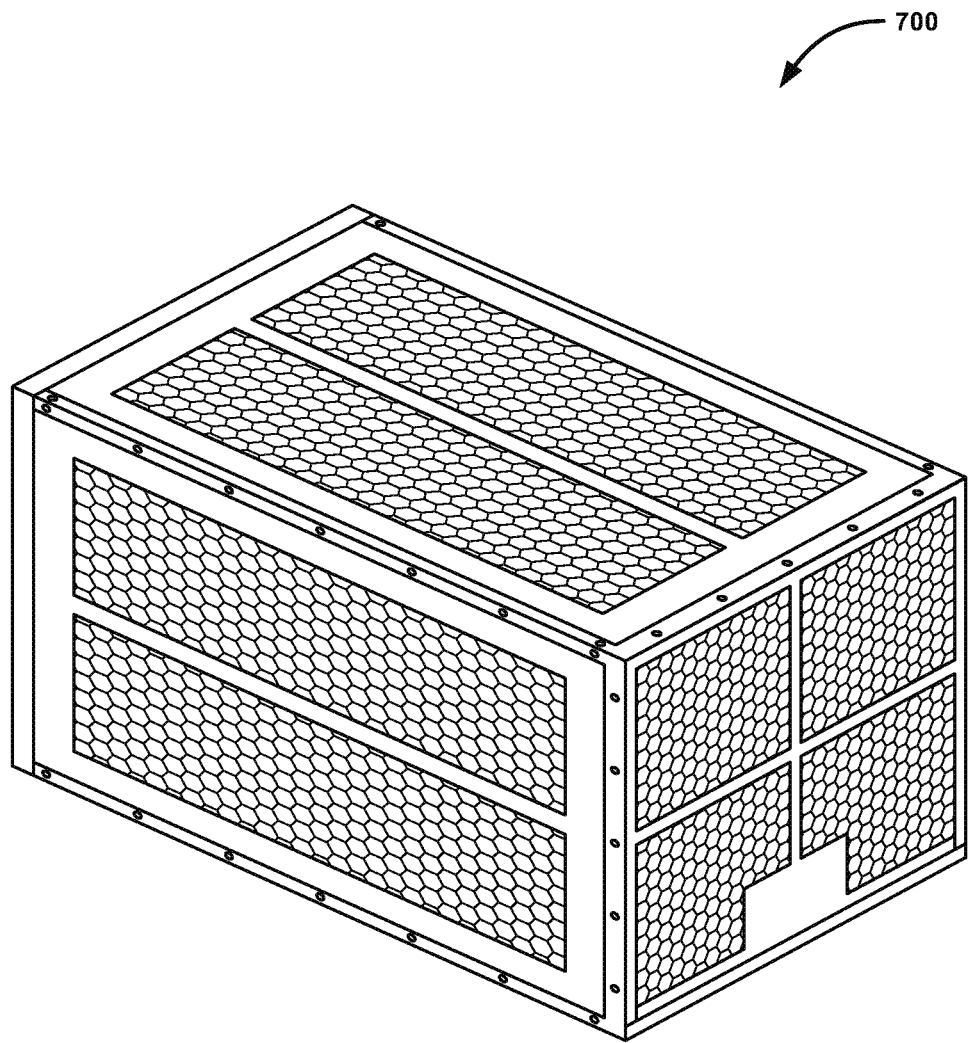
FIG. 7A shows a top perspective view of the cabinet assembly, in accordance with an embodiment of the present invention.
Figure 7B:
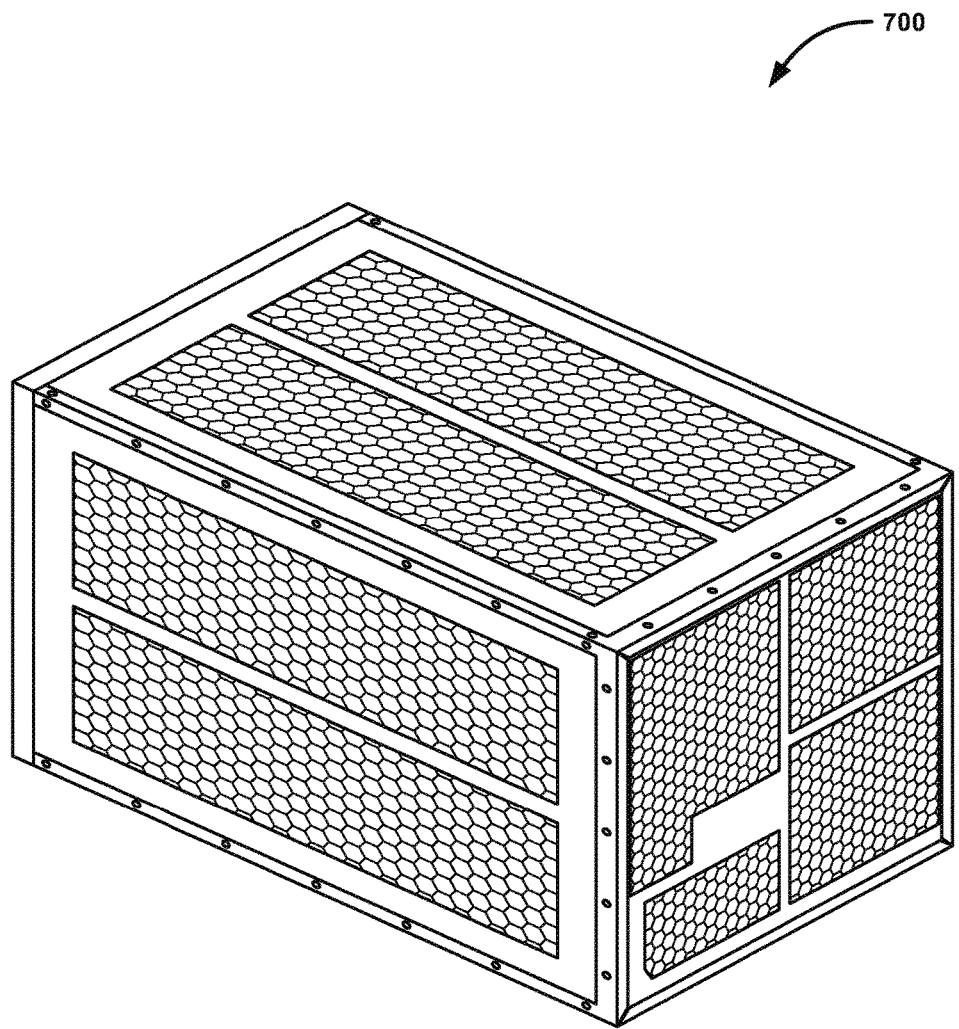
FIG. 7B shows a top perspective view of the cabinet assembly, in accordance with another embodiment of the present invention.

FIG. 7A shows a top perspective view of the cabinet assembly 700, in accordance with an embodiment of the present invention. The cabinet assembly 700 is obtained after attaching the front portion 100, the back portion 200, the first side portion 300, the second side portion 400, the top portion 500, and the bottom portion 600 together. The cabinet assembly 700 of FIG. 7A shows the front portion 100, the first side portion 300, and the top portion 500. FIG. 7B shows a top perspective view of the cabinet assembly 700, in accordance with another embodiment of the present invention. The cabinet assembly 700 of FIG. 7B shows the back portion 200, the first or second side portion 300 or 400, and the top portion 500.

Figure 8A:
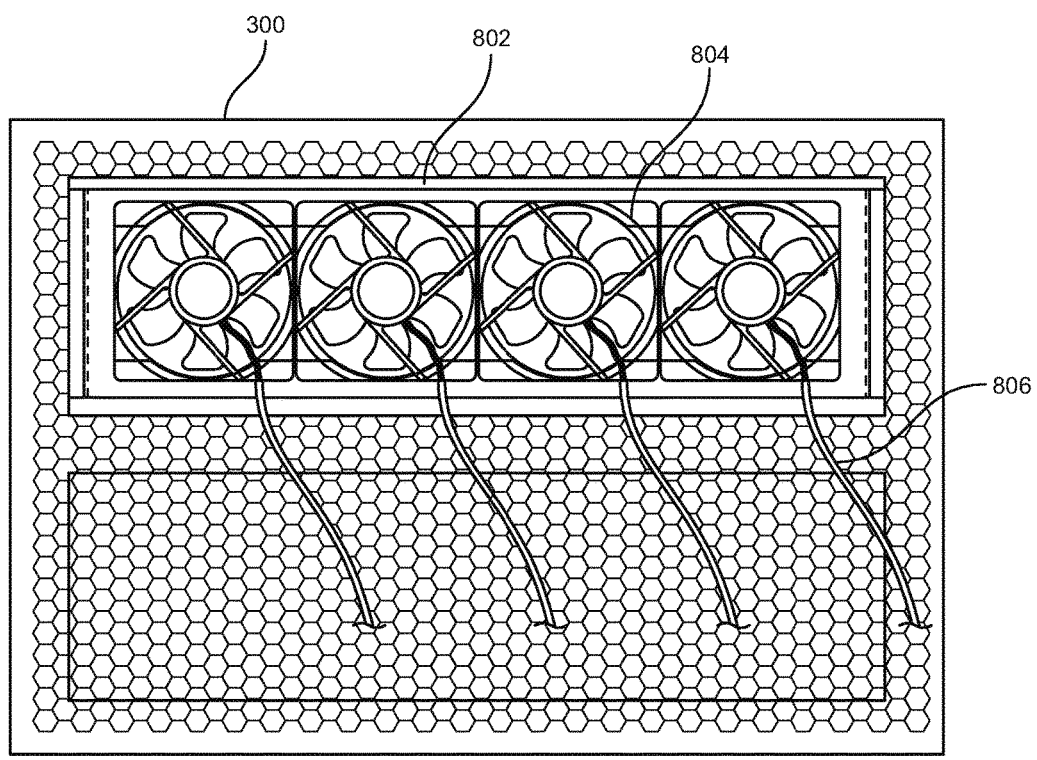
FIG. 8A shows a cross sectional side view of the first side portion with a fan mounting bracket of the cabinet assembly, in accordance with an embodiment of the present invention.

FIG. 8A shows a cross sectional side view of the first or second side portion 300 or 400 with a fan mounting bracket 802 of the cabinet assembly 700, in accordance with an embodiment of the present invention. The fan mounting bracket 802 is attached to an outer surface of one of the first or second side portion 300 or 400, as shown in FIG. 8A. The fan mounting bracket 802 is further attached with a plurality of fans, such as a fan 804, in their respective slots for dissipating heat generated by the server. Each of the plurality of fans has a power supply cord, such as a cord 806 that can be connected to a power supply associated with the server for turning ON a respective fan.

Figure 8B:
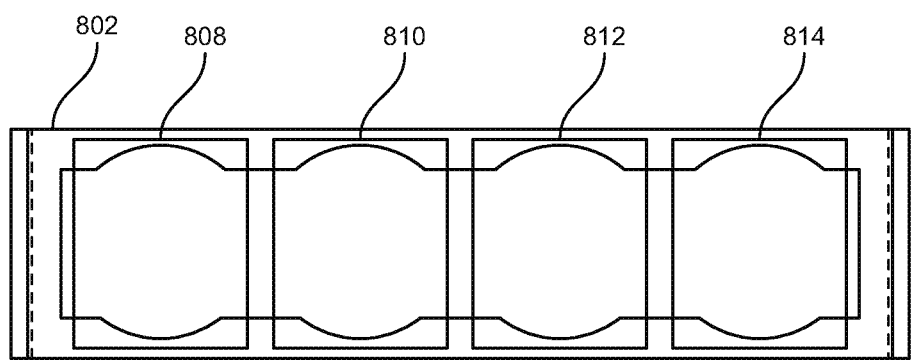
FIG. 8B shows a line diagram of the fan mounting bracket of the cabinet assembly, in accordance with an embodiment of the present invention.
Figure 8C:
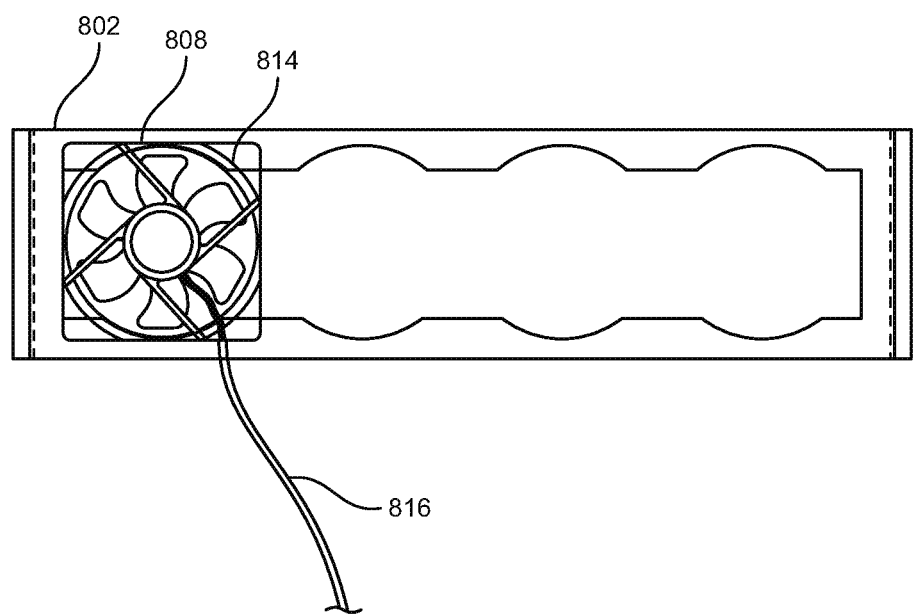
FIG. 8C shows a top perspective view of the fan mounting bracket of the cabinet assembly, in accordance with an embodiment of the present invention.

FIG. 8B shows a line diagram of the fan mounting bracket 802 of the cabinet assembly 700, in accordance with an embodiment of the present invention. The dimension of the fan mounting bracket 802 is 14.25 inches by 4.25 inches. The fan mounting bracket 802 includes a plurality of fan slots, such as first, second, third, and fourth fan slots 808, 810, 812, and 814, as shown in FIG. 8B. The width of each fan slot is 2.82 inches. Each fan slot of the fan mounting bracket 802 includes at least two arcs of the same radius and the two arcs are arranged opposite to each other, as shown in FIG. 8B. Further, the radius of each arc is 1.593 inches. The plurality of fan slots is formed such that there is a gap between two adjacent fans when mounted therein. For example, the gap is 0.433 inch between two adjacent mounting spaces associated with their respective fan slots. The fans are mounted in their respective fan slots by means of screws. The mounting of each fan requires at least four screws. FIG. 8C shows a top perspective view of the fan mounting bracket 802 of the cabinet assembly 700, in accordance with an embodiment of the present invention, in which a fan 814 has been shown and the fan 814 is mounted over the first fan slot 808. The power supply cord 816 of the fan 814 may be connected to the power supply for turning ON the fan 814.

Figure 9A:
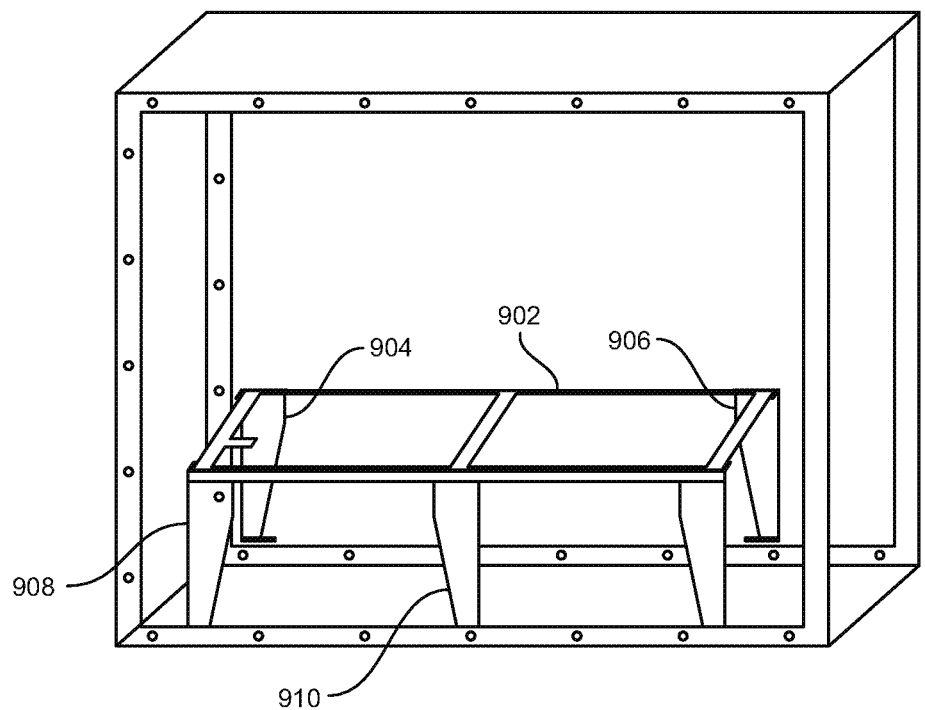
FIG. 9A shows a top perspective view of a chassis arrangement of the cabinet assembly, in accordance with an embodiment of the present invention.

FIG. 9A shows a top perspective view of a chassis arrangement 902 of the cabinet assembly 700, in accordance with an embodiment of the present invention. The chassis arrangement 902 is included inside the cabinet assembly 700 for mounting at least one motherboard of the server. The at least one motherboard is mounted on top of the chassis arrangement 902. The chassis arrangement 902 is attached with a plurality of legs, such as a first, second, third, and fourth legs 904, 906, 908, and 910, as shown in FIG. 9A. The first, second, third, and fourth legs 904, 906, 908, and 910 are attached to the bottom portion 600 and thus provide support to the chassis arrangement 902.

Figure 9B:
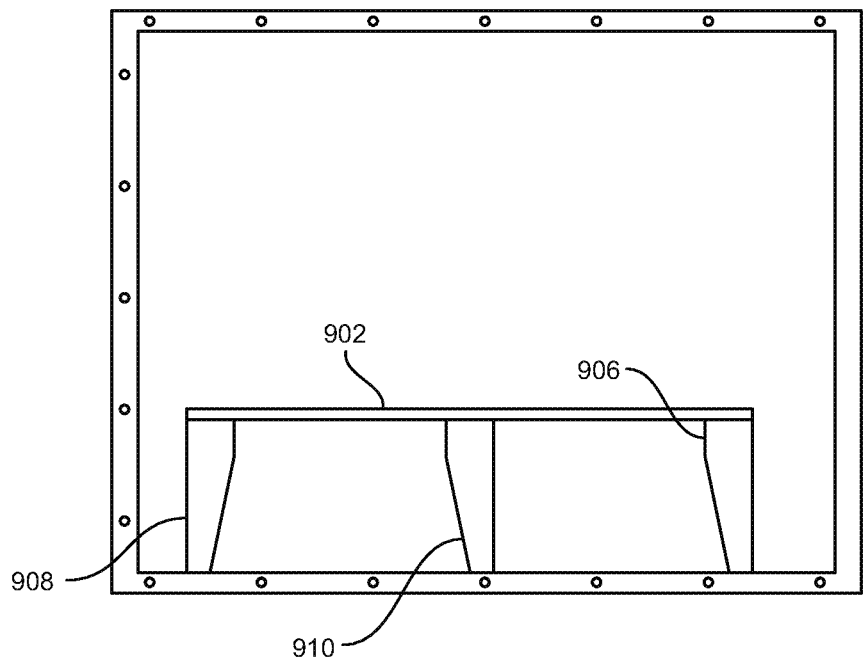
FIG. 9B shows a cross sectional side view of the chassis arrangement of the cabinet assembly, in accordance with another embodiment of the present invention.

FIG. 9B shows a cross sectional side view of the chassis arrangement 902 of the cabinet assembly 700, in accordance with another embodiment of the present invention. The chassis arrangement 902 is attached to the second, third, and fourth legs 906, 908, and 910. The cabinet assembly 700 further includes a metallic case (not shown) with at least one open side. The metallic case is placed below the chassis arrangement 902 and is attached to the bottom portion 600. The power supply device of the server is also placed on the bottom portion 600 such that some portions of the power supply device is below the chassis arrangement 902 and the remaining portions of the power supply device is outside the chassis arrangement 902. Also, one end of power supply device is fitted across the open gateway of the third back section 206 of the back portion 200.

Figure 9C:
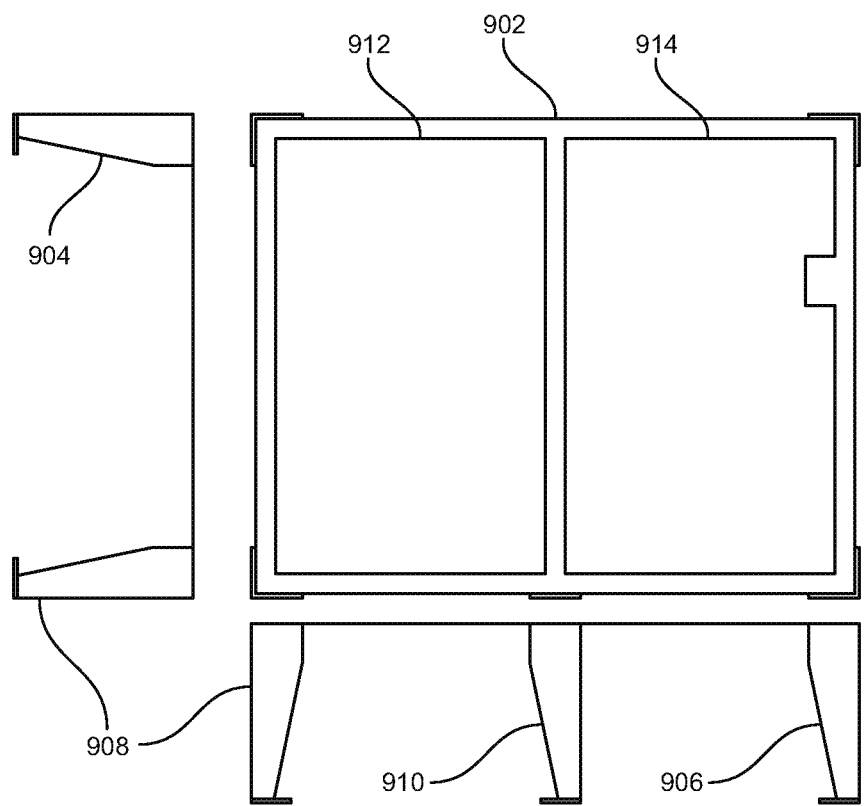
FIG. 9C shows a line diagram of the chassis arrangement of the cabinet assembly, in accordance with an embodiment of the present invention.

FIG. 9C shows a line diagram of the chassis arrangement 902 of the cabinet assembly 700, in accordance with an embodiment of the present invention. The chassis arrangement 902, as shown, requires a minimum of four legs 904, 906, 908, and 910. The height of each of the first, second, third, and fourth legs 904, 906, 908, and 910 is 3.75 inches and the width varies from 0.5 inch to 1.0 inch. The first and second legs 904 and 906 are 11.339 inches apart from each other from their center positions. The first and third legs 904 and 908 are 9.5 inches apart from each other from their center positions. The third and fourth legs 908 and 910 are 6.190 inches apart from each other from their center positions. Further, in an embodiment, the top base of the chassis arrangement 902 is divided into a plurality of sections, such as a first top section 912 and a second top section 914. The dimension of each of the first top section 912 and the second top section 914 is 5.75 inches by 9.5 inches.

Although the present invention has been described with respect to the cabinet assembly 700 (for the server) with the front, back, first side, second side, top, and bottom portions 100, 200, 300, 400, 500, and 600, it should be understood that the proposed cabinet assembly 700 can be formed with varying shapes and sizes, and thus the disclosure here should not be considered limited to the exemplary embodiments and processes described herein, especially the various dimension data should not be construed as limiting. The various dimensions may be modified to fit in specific application areas.

Although particular embodiments of the invention have been described in detail for purposes of illustration, various modifications and enhancements may be made without departing from the spirit and scope of the invention.

What is claimed is:

1. A cabinet assembly for a server, the cabinet assembly comprising:
   a front portion, a back portion, a first side portion, a second side portion, a top portion, and a bottom portion forming a cubical compartment when assembled therein;
   a chassis arrangement having a plurality of legs that are attached to the bottom portion, wherein the chassis arrangement is used for mounting at least one motherboard of the server inside the cubical compartment, wherein the chassis arrangement is divided into a plurality of sections including at least a first top section and a second top section for mounting at least the one motherboard of the server, and wherein a size of the chassis arrangement is less than a size of the bottom portion such that there is a gap between the chassis arrangement and the first side portion and a gap between the chassis arrangement and the second side portion, when the chassis arrangement is attached to the bottom portion; and
   a fan mounting bracket having a plurality of fan slots for mounting a plurality of fans for dissipating heat generated by the server, wherein the fan mounting bracket is attached to an outer surface of one of the first side portion or the second side portion.

2. The cabinet assembly of claim 1, wherein the front portion is divided into a plurality of sections including at least first, second, third, and fourth front sections, and wherein the first and second front sections are symmetrical and parallel, and forms an upper half of the front portion, and the third and fourth front sections are symmetrical and parallel, and forms a lower half of the front portion.

3. The cabinet assembly of claim 2, wherein shape and size of the first and second front sections are different from shape and size of the third and fourth front sections, and wherein each of the first, second, third, and fourth front sections includes a perforated metallic sheet having a plurality of symmetrical openings, and wherein each symmetrical opening has a hexagonal shape.

4. The cabinet assembly of claim 3, wherein the first and second front sections are quadrilateral-shaped sections, and the third and fourth front sections are irregular pentagonal-shaped or hexagonal-shaped sections.

5. The cabinet assembly of claim 3, wherein the back portion further includes a fifth back section, wherein the fifth back section is a metallic plate including a quadrilateral-shaped opening, and wherein the fifth back section is between the first and third back sections.

6. The cabinet assembly of claim 2, wherein the front portion further includes a plurality of quadrilateral-shaped openings below the third and fourth front sections, wherein the plurality of quadrilateral-shaped openings are evenly formed with respect to each other in a row on an extended metallic plate.

7. The cabinet assembly of claim 2, wherein the front portion is attached to a first metallic handle, wherein the first metallic handle is fixed along a horizontal plane that is parallel to the top portion, and wherein the first metallic handle is rotatable along its axis.

8. The cabinet assembly of claim 2, wherein the front portion further includes a fifth front section that joins portions of the third and fourth front sections, wherein the fifth front section is a metallic plate that is used for depicting specification of the cabinet assembly, and wherein the fifth front section is at the bottom of the front portion along a central vertical axis of the front portion.

9. The cabinet assembly of claim 1, wherein the back portion is divided into a plurality of sections including at least first, second, third, and fourth back sections, and wherein the second and fourth back sections are symmetrical and parallel to each other.

10. The cabinet assembly of claim 9, wherein shape and size of the first and third back sections are different from shape and size of the second and fourth back sections, and wherein the third and fourth back sections are below the first and second back sections, respectively.

11. The cabinet assembly of claim 9, wherein each of the first, second, and fourth back sections includes a perforated metallic sheet having a plurality of symmetrical openings, wherein each symmetrical opening has a hexagonal shape, and wherein the third back section is an open gateway for externally connecting a power supply of the server, and wherein the power supply is placed inside the cubical compartment.

12. The cabinet assembly of claim 9, wherein the back portion is attached to a second metallic handle, wherein the second metallic handle is fixed along a horizontal plane that is parallel to the top portion, and wherein the second metallic handle is rotatable along its axis.

13. The cabinet assembly of claim 1, wherein the first or second side portion is divided into a plurality of sections including at least first and second side sections, wherein the first and second side sections are symmetrical and parallel to each other, and wherein the second side section is below the first side section, and wherein each of the first and second side sections includes a perforated metallic sheet having a plurality of symmetrical openings, and wherein each symmetrical opening has a hexagonal shape.

14. The cabinet assembly of claim 1, wherein the top portion is divided into a plurality of sections including at least first and second top sections, wherein the first and second top sections are symmetrical and parallel to each other, and wherein each of the first and second top sections includes a perforated metallic sheet having a plurality of symmetrical openings, and wherein each symmetrical opening has a hexagonal shape.

15. The cabinet assembly of claim 1, wherein the bottom portion is divided into a plurality of sections including at least first and second bottom sections, wherein the first and second bottom sections are parallel to each other, and wherein a width of the first bottom section is same as a width of the second bottom section, and a length of the first bottom section is less than a length of the second bottom section, and wherein each of the first and second bottom sections includes a perforated metallic sheet having a plurality of symmetrical openings, wherein each symmetrical opening has a hexagonal shape.

16. The cabinet assembly of claim 15, wherein the bottom portion is attached to a plurality of standoff screws, wherein the cubical compartment stands on the plurality of standoff screws.

17. The cabinet assembly of claim 1, wherein the at least one motherboard is mounted on top of the chassis arrangement.

18. The cabinet assembly of claim 1, wherein the plurality of fan slots are formed such that there is a gap between two adjacent fans when mounted therein, wherein the gap is 0.433 inch between two adjacent mounting spaces associated with their respective fan slots, and wherein each fan slot of the fan mounting bracket includes at least two arcs of the same radius, and wherein the two arcs are opposite to each other, and wherein the radius of each arc is 1.593 inches.

* * * * *